(12) United States Patent
Ling

(10) Patent No.: US 7,532,870 B2
(45) Date of Patent: *May 12, 2009

(54) METHOD AND APPARATUS FOR DC OFFSET REMOVAL

(75) Inventor: Curtis Ling, San Diego, CA (US)

(73) Assignee: MaxLinear, Inc., Carlsbad, CA (US)

( * ) Notice: Subject to any disclaimer, the term of this patent is extended or adjusted under 35 U.S.C. 154(b) by 338 days.

This patent is subject to a terminal disclaimer.

(21) Appl. No.: 11/106,061

(22) Filed: Apr. 13, 2005

(65) Prior Publication Data

US 2005/0248478 A1    Nov. 10, 2005

Related U.S. Application Data

(60) Provisional application No. 60/562,080, filed on Apr. 13, 2004, provisional application No. 60/562,072, filed on Apr. 13, 2004.

(51) Int. Cl.
*H04B 1/10* (2006.01)

(52) U.S. Cl. ............... 455/130; 455/283; 455/296; 455/317

(58) Field of Classification Search ......... 455/283–384, 455/295–296, 302–306, 313–326
See application file for complete search history.

(56) References Cited

U.S. PATENT DOCUMENTS

| | | | |
|---|---|---|---|
| 4,653,117 A | 3/1987 | Heck et al. | |
| 4,814,715 A | 3/1989 | Kasperkovitz | |
| 5,999,802 A | 12/1999 | Aschwanden | |
| 6,166,668 A * | 12/2000 | Bautista et al. | 341/118 |
| 6,240,100 B1 | 5/2001 | Riordan et al. | |
| 6,282,413 B1 | 8/2001 | Baltus | |
| 6,334,051 B1 | 12/2001 | Tsurumi et al. | |
| 6,356,218 B1 * | 3/2002 | Brown et al. | 341/120 |

(Continued)

FOREIGN PATENT DOCUMENTS

EP    0594894 A1    5/1994

(Continued)

OTHER PUBLICATIONS

Guo, Chunbing, et al. "A Fully Integrated 90-MHz CMOS Wireless Receiver With On-Chip RF and IF Filters and 79-dB Image Rejection", *IEEE Journal of Solid-State Circuits* (2002) 37(8):1084-1089.

(Continued)

*Primary Examiner*—Simon D Nguyen
(74) *Attorney, Agent, or Firm*—Townsend and Townsend and Crew LLP

(57) ABSTRACT

A DC offset removal method and apparatus for use with a receiver, such as a direct conversion receiver. The DC offset error can be upconverted to an intermediate frequency where it appears as a DC offset spurious signal. The DC offset spurious signal can be amplified and downconverted back to a DC signal. The DC signal can be used to determine an offset correction value that can be coupled to a signal path to substantially remove the DC offset error. An embodiment is disclosed that allows a single module to be used to remove the static and dynamic DC offset error components. Another embodiment includes separate portions for the removal of static and dynamic offset errors.

6 Claims, 8 Drawing Sheets

U.S. PATENT DOCUMENTS

| | | | |
|---|---|---|---|
| 6,498,929 B1* | 12/2002 | Tsurumi et al. | 455/296 |
| 6,606,359 B1 | 8/2003 | Nag et al. | |
| 6,868,128 B1 | 3/2005 | Lane | |
| 7,327,198 B2 | 2/2008 | Pan | |
| 2002/0151289 A1 | 10/2002 | Rahman et al. | |
| 2002/0160738 A1* | 10/2002 | Allott et al. | 455/304 |
| 2003/0003891 A1 | 1/2003 | Kivekas et al. | |
| 2003/0129955 A1 | 7/2003 | Gilmore | |
| 2003/0142234 A1 | 7/2003 | Dent | |
| 2003/0186669 A1 | 10/2003 | Yamawaki et al. | |
| 2003/0207674 A1* | 11/2003 | Hughes | 455/234.1 |
| 2004/0038649 A1* | 2/2004 | Lin et al. | 455/130 |
| 2005/0059376 A1 | 3/2005 | Davis | |
| 2005/0221781 A1 | 10/2005 | Lin et al. | |
| 2005/0233723 A1 | 10/2005 | Gomez et al. | |
| 2005/0239428 A1 | 10/2005 | Seendripu | |
| 2006/0025099 A1 | 2/2006 | Jung et al. | |
| 2006/0223457 A1 | 10/2006 | Rahman | |
| 2006/0252399 A1 | 11/2006 | Paulus | |
| 2007/0077908 A1 | 4/2007 | Vorenkamp et al. | |

FOREIGN PATENT DOCUMENTS

| | | |
|---|---|---|
| EP | 0840484 A2 | 5/1998 |
| EP | 0964557 A1 | 12/1999 |
| EP | 1172928 A2 | 1/2002 |
| EP | 1294151 A1 | 3/2003 |
| WO | WO 97/06604 A1 | 2/1997 |
| WO | WO 02/29985 A2 | 4/2002 |
| WO | 04/006433 | 1/2004 |

OTHER PUBLICATIONS

Lee, Kang-Yoon, et al. "Full-CMOS 2-GHz WCDMA Direct Conversion Transmitter and Receiver", *IEEE Journal of Solid-State Circuits* (2003) 38(1):43-53.

Aschwanden, F., "Direct conversion-how to make it work in TV tuners", *IEEE Transactions on Consumer Electronics*, 42(3):729-738 (1996).

Weaver, Donald K. "A Third Method of Generation and Detection of Single-Sideband Signals", *Proceedings of the IRE*, 44(12):1703-1705 (1956).

International Search Report of Oct. 12, 2005 in International Application No. PCT/US2005/012907.

Written Opinion of Oct. 12, 2005 in International Application No. PCT/US2005/012907.

International Preliminary Report on Patentability of Oct. 19, 2006 in International Application No. PCT/US2005/012907.

International Search Report of Aug. 2, 2005 in International Application No. PCT/US2005/012906.

Written Opinion of Aug. 2, 2005 in International Application No. PCT/US2005/012906.

International Preliminary Report of Patentability of Oct. 19, 2006 in International Application No. PCT/US2005/012906.

Communication of May 16, 2008 in European application 05738651.8.

Weldon, Jeffery A., "A 1.75-GHz Highly Integrated Narrow-Band CMOS Transmitter With Harmonic-Rejection Mixers," IEEE Journal of Solid-State Circuits, 36(12):2003-2015 (2001).

Van Sinderen, Jan, et al., "A 48-860 MHZ Digital Cable Tuner IC With Integrated RF and IF Selectivity," International Solid-State Circuits Conference, 2003 Digest of Technical Papers, pp. 444-506 (200.

Written Opinion of Mar. 31, 2004 in International Application No. PCT/US2005/045099.

International Preliminary Report on Patentability of Jun. 21, 2007 in International Application No. PCT/US2005/045099.

International Search Report on Mar. 4, 2006 in International Application No. PCT.US2005/045099.

\* cited by examiner

METHOD AND APPARATUS FOR DC OFFSET REMOVAL

CROSS-REFERENCES TO RELATED APPLICATIONS

This application claims the benefit of U.S. Provisional Application No. 60/562,080, filed Apr. 13, 2004, entitled "DUAL CONVERSION RECEIVER ARCHITECTURE WITH PROGRAMMABLE INTERMEDIATE FREQUENCY AND EFFICIENT CHANNEL SELECTION SUITABLE FOR COMPLETE INTEGRATION ON A SINGLE INTEGRATED CIRCUIT" and U.S. Provisional Application No. 60/562,072, filed Apr. 13, 2004 and entitled "REMOVAL OF DC OFFSET IN DIRECT CONVERSION RECEIVER," each of which is hereby incorporated herein by reference in its entirety.

BACKGROUND OF THE DISCLOSURE

The disclosure relates to electronic communications. More particularly, the disclosure relates to a dual conversion receiver for use in electronic communication systems.

In a typical frequency division multiplex communication system, multiple transmissions can simultaneously occupy a predefined operating band. The signals within the operating band can operate according to a predetermined communication standard, and thus, can have an energy within a predictable dynamic range. The communication standard can also specify a frequency spacing between adjacent channels, and the channel bandwidth. The communication standard can also specify signal parameters, such as modulation type, information rates, out of channel performance, as well as other signal parameters.

Additionally, there can be numerous signal sources operating outside of the operating band. Unlike the signals within the operating band, the out of band signals are typically not regulated by the communication standard regulating the in band signal performance. As a result, out of band signals may have substantially greater energy relative to the in-band signals, and can operate according to different signal parameters, including modulation type, out of band performance, and other parameters.

Examples of communication systems that use some form of frequency division multiplexing include, but are not limited to, television, radio, wireless communications, including cellular telephones, cordless telephones, and transceivers. Each of these communication systems can rely on the ability of a receiver to extract the desired signal from a host of interference sources.

Many receiver implementations have been developed to support the various communication standards. The trend of increasing device complexity and performance while simultaneously reducing the physical size of electronic devices imposes tremendous constraints on ongoing development.

For example, the size of cellular and cordless telephones continues to shrink while simultaneously improving the quality of the device and adding additional functionality to the device. Similarly, radios and televisions are constantly being redesigned to provide improved features while simultaneously decreasing physical size. Although the screen size available in television receivers continues to grow, the advancement of technologies that enable flat screens and short depths greatly reduce the volume available for electronics. The cavernous cabinet that was once associated with televisions is largely eliminated due to the advancement of screen technologies.

The complexity and corresponding performance of digital circuits, such as processors, has increased tremendously. The performance increase of digital circuits is accompanied by a corresponding decrease in the physical size required for a device performing the function of the digital circuits.

The size of analog circuits has decreased over time, and the performance of analog circuits has increased based on advancing architectures and materials. However, the advancement of analog circuits, particularly analog circuits for use in Radio Frequency (RF) applications, has not experienced the tremendous advancement seen in digital circuits.

In RF circuits, the quality of individual elements, such as inductors and capacitors, continues to exert a great influence on the performance of the associated RF circuits. As such, device miniaturization and communication system performance enhancement can be limited by the performance of the analog portions of a device, including the RF portions of the device.

Therefore, it is desirable to improve the performance of the analog portions of a device while simultaneously reducing the physical size occupied by the analog portions. In communication systems, it is desirable to increase the performance of the receiver while simultaneously reducing its physical size.

BRIEF SUMMARY OF THE DISCLOSURE

A dual conversion receiver architecture that converts a radio frequency signal to produce a programmable intermediate frequency whose channel bandwidth and frequency can be changed using variable low-pass filtering to accommodate multiple standards for television and other wireless standards. The dual conversion receiver uses a two stage frequency translation and continual DC offset removal. The dual conversion receiver can be completely implemented on an integrated circuit with no external adjustments.

A DC offset removal method and apparatus for use with a receiver is disclosed. The DC offset error can be upconverted to an intermediate frequency where it appears as a DC offset spurious signal. The DC offset spurious signal can be amplified and downconverted back to a DC signal. The DC signal can be used to determine an offset correction value that can be coupled to a signal path to substantially remove the DC offset error. An embodiment is disclosed that allows a single module to be used to remove the static and dynamic DC offset error components. Another embodiment includes separate portions for the removal of static and dynamic offset errors.

The disclosure includes a method of canceling a DC offset error in a signal path of a receiver including canceling a static DC offset error component on the signal path, and canceling a dynamic DC offset error component in the signal path in the presence of a signal component.

The disclosure includes a method of canceling a DC offset error in a signal path of a receiver including frequency converting the DC offset error to a DC offset spurious signal (DCOS), amplifying the DCOS signal to generate an amplified DCOS signal, frequency converting the amplified DCOS signal to a baseband signal, determining a DC offset correction value based on the baseband signal, and providing a DC correction to the signal path based on the DC offset correction value.

The disclosure includes a method of canceling a DC offset error in a signal path of a receiver including coupling a DC offset error from the signal path, removing substantially a DC offset error attributable to a DC offset correction portion to produce a corrected DC offset error, subtracting a value of static DC offset error from the corrected DC offset error to produce a dynamic DC offset error value, determining a DC offset correction value based on the dynamic DC offset value, and providing a DC correction signal to the signal path based on the DC offset correction value.

The disclosure includes a DC offset correction apparatus configured to correct a DC offset error in a signal path of a receiver that includes a first frequency conversion module coupled to the signal path and configured to frequency convert a DC offset error on the signal path to a DC offset spurious signal (DCOS), an amplifier coupled to the first frequency conversion module and configured to amplify the DCOS signal to generate an amplified DCOS signal, a second frequency conversion module coupled to the amplifier and configured to frequency convert the amplified DCOS signal to a DC signal, a search module coupled to the second frequency conversion module and configured to determine a digital DC offset correction value based on the DC signal, and a digital to analog converter (DAC) coupled to the search module and configured to provide a DC correction to the signal path based on the digital DC offset correction value.

The disclosure includes a DC offset correction apparatus configured to correct a DC offset error in a signal path of a receiver including a static DC offset correction portion configured to substantially remove a static DC offset error from the signal path, a signal summer configured to subtract a value of static DC offset error from a composite DC offset error to produce a dynamic DC offset error value, a search module configured to determine a dynamic DC offset correction value based on the dynamic DC offset error value, and a digital to analog converter coupled to the search module and configured to provide a dynamic DC correction signal to the signal path based on the dynamic DC offset correction value.

Various features and advantages of the invention can be more fully appreciated with reference to the detailed description and accompanying drawings that follow.

BRIEF DESCRIPTION OF THE DRAWINGS

The features, objects, and advantages of embodiments of the disclosure will become more apparent from the detailed description set forth below when taken in conjunction with the drawings, in which like elements bear like reference numerals.

DETAILED DESCRIPTION OF EMBODIMENTS OF THE INVENTION

Figure 1:
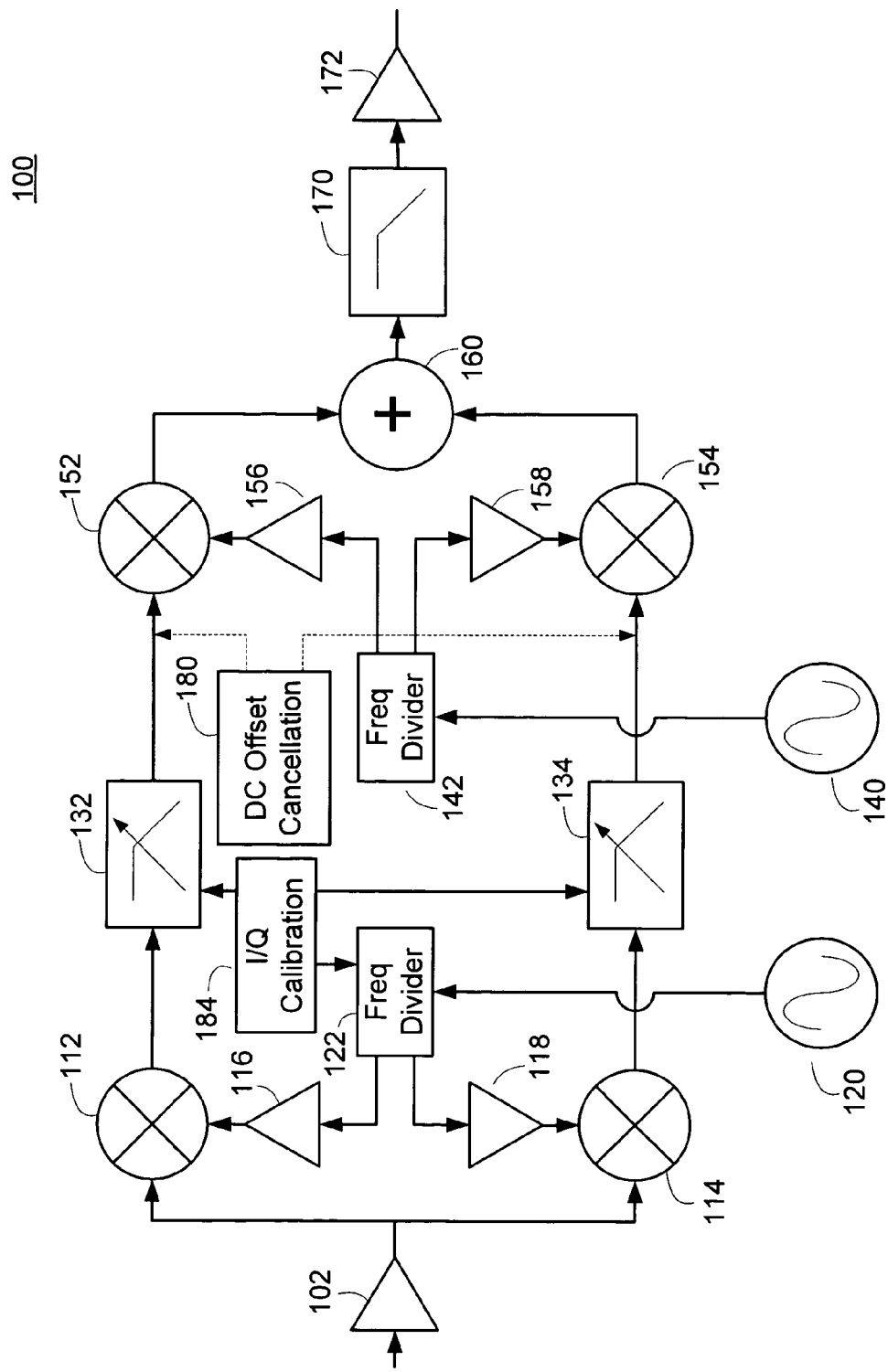
FIG. 1 is a simplified functional block diagram of an embodiment of a dual conversion receiver.

The disclosed dual conversion receiver uses a two stage frequency translation and continual DC offset removal, and can be completely implemented on an integrated circuit with no external adjustments. The disclosed dual conversion receiver can be used for high-performance radio standards such as television by inclusion of a DC offset removal circuit. The DC offset removal circuit can operate continually and can be made to be sufficiently sensitive to remove unwanted offsets introduced by Local Oscillator (LO) leakage or mixer and baseband circuitry mismatches. In one embodiment, a variable low-pass filter at baseband can be configured to accommodate multiple standards such as those found in television. Embodiments may also include a variable second local oscillator frequency configured to produce a variable intermediate frequency to accommodate multiple demodulator requirements.

A downconversion receiver system may require mechanisms for removing undesired DC offsets introduced by imperfections and mismatches in the circuit components and LO leakage in mixers resulting in self mixing. However, it is difficult to remove the DC offset with great precision using conventional techniques, because these methods introduce their own DC offsets to the system and further corrupt the desired signal. Additionally, it is difficult to remove DC offset dynamically when the system is receiving a desired channel. The disclosed DC offset correction mechanisms circumvent these difficulties and are capable of reducing the DC offset to levels sufficiently low to accommodate high performance applications such as television.

The disclosed dual conversion receiver can be particularly useful for drop-in replacement for use in existing designs. The disclosed dual conversion receiver can be made to be fully compatible with existing hardware, requiring no modifications to, for example, standard demodulator chips and circuitry. This makes the disclosed dual conversion receiver immediately compatible with existing components and modules. Additionally, the disclosed dual conversion receiver can be implemented entirely on a single integrated circuit. The integrated circuit having the disclosed dual conversion receiver can be configured to require no external adjustments. The dual conversion receiver integrated circuit can be configured to receive one or more control inputs that can be configured to control the local oscillator frequencies, filter bandwidths, and amplifier gains.

The dual conversion receiver can be used for a wide variety of communication receivers where a desired signal needs to be downconverted and separated from undesired signals and where signal integrity is very important. The disclosed dual conversion receiver can be particularly advantageous where the application has stringent specifications for undesired spurious signals from various sources, such as DC offset. Examples of such applications are television, radio, wireless communications including cellular, cordless and portable transceivers.

In one embodiment, a radio signal consisting of desired and undesired channels and interference can be fed into a receiver by an antenna, wires, or cable. The received signal can be amplified and downconverted using a first set of in-phase and quadrature mixers driven by a first LO to baseband where it can be filtered using a low-pass filter to reject unwanted signals. The low-pass filters can be adjustable in bandwidth to accommodate different standards, which may have different filtering requirements. An upconversion using a second set of in-phase and quadrature mixers driven by a second local oscillator can convert the baseband to an intermediate frequency which can be flexibly chosen by the user. A sensitive DC offset correction loop can remove undesirable DC components added by device mismatches in the mixers and baseband circuits.

FIG. 1 is a simplified functional block diagram of an embodiment of a receiver 100 that can be implemented on one or more substrates of one or more integrated circuits (ICs). In some embodiments, it may be advantageous to integrate the entire receiver on a single IC. In other embodiments, it may be advantageous to integrate a portion of the receiver 100 in a first IC or on a first substrate and integrate the remainder of the receiver 100 on a second IC or second substrate.

Although the signal interconnections shown in FIG. 1 appear as single ended signal interconnects, it is generally understood that some or all of the interconnections can be differential connections. It may be advantageous to implement differential interconnections, for example, for the purposes of noise reduction.

The receiver 100 can include an RF amplifier 102 that is configured to receive a signal at the input to the receiver 100 and amplify it. The RF amplifier 102 can be configured to receive a signal, for example, from an interconnect to an antenna or wired connection, such as a single ended wireline, a differential wireline, a twisted pair, a coaxial cable, a transmission line, a waveguide, an optical receiver configured to receive an optical signal over an optical fiber, and the like, or some other signal medium.

The RF amplifier 102 can be configured in any of several different embodiments or combination of embodiments, depending on the application. In one embodiment, the RF amplifier 102 can be a Low Noise Amplifier (LNA). In another embodiment, the RF amplifier 102 can be a variable gain amplifier, and the gain of the RF amplifier can be selected by one or more control lines (not shown) to the receiver 100. In the embodiment where the RF amplifier 102 is a variable gain amplifier, the gain of the RF amplifier 102 can be part of a gain control loop, such as am automatic gain control (AGC) loop (not shown). The RF amplifier 102 can be configured as a single amplifier stage or can include multiple amplifier stages. Where multiple amplifier stages are used, the amplifier stages can include serial, parallel, or a combination of serial and parallel amplifier configurations.

The output of the RF amplifier 102 can be coupled to inputs of first and second frequency conversion modules, here shown as a first mixer 112 and a second mixer 114. The first and second mixers 112 and 114 are shown as mixers, but can be any type of frequency conversion apparatus. The first and second mixers 112 and 114 can be configured to generate in-phase (I) and quadrature (Q) frequency converted signal components. The first mixer 112 is described as part of the in-phase signal path and the second mixer 114 is described as part of the quadrature signal path for purposes of discussion.

An RF LO 120 can be configured to generate a local oscillator signal to frequency convert the received RF signal to a baseband signal or a low Intermediate Frequency (IF) signal. As used herein, the term baseband signal refers to baseband signals as well as to signals that are substantially baseband signals. A signal is substantially a baseband signal if the frequency conversion process to downconvert a signal is imperfect, for example, due to LO errors or differences at the transmitter or receiver and errors or differences in the RF signal relative to a specified frequency of operation. For example, an RF signal may be different from a specified operating channel due to LO frequency shifts at the transmitter or Doppler shifts. Typically, the error or difference is a fraction of the baseband signal bandwidth.

A low IF signal can refer to an IF frequency that is less than twice the baseband signal bandwidth. However, in other embodiments, low IF can refer to less than 1.5, 2.5, 3, 4, 5, 10, or some other multiple of the baseband signal bandwidth.

The frequency of the RF LO 120 can be programmable, and the frequency can be programmed based in part on the frequency of the desired signal. In a direct conversion frequency conversion, the output of the RF LO 120 can be substantially equal to the center frequency of a double side band input signal. In other embodiments, such as the one shown in FIG. 1, the RF LO 120 can be tuned to a frequency that is a multiple of the desired input frequency. In the embodiment of FIG. 1, the RF LO 120 can be tuned to a frequency that is substantially four times the frequency of the desired signal.

The output of the RF LO 120 can be coupled to a first phase shifter 122 that can be configured to generate at least two distinct versions of a LO signal that are in quadrature. Because inaccuracies in the quadrature LO signals can contribute to undesired signal components in the recovered signal, it can be desirable to generate accurate quadrature LO signals. In one embodiment, the first phase shifter 122 can include a phase shifted signal path and a direct signal path, where the phase shifted signal path results in a signal that is substantially 90 degrees shifted relative to the signal from the direct signal path. In another embodiment, the first phase shifter 122 can include a polyphase filter that is configured to generate the two LO signals in quadrature. In the embodiment shown in FIG. 1, the first phase shifter is implemented using a divide by four scaler.

Using a divide by four scaler for the first phase shifter 122 can be advantageous when generating differential LO signals in quadrature. In one embodiment, the divide by four scaler can have four separate outputs, each of which is delayed in time by a multiple of one quarter of the output signal period, with the multiples ranging from zero to three. In such a configuration, the signals delayed by zero and two quarters of the output signal period can represent the differential in-phase LO signal. Similarly, the signals delayed by one and three quarters of the output signal period can represent the differential quadrature LO signal.

The in-phase LO signal can be coupled to an in-phase LO buffer amplifier 116 that amplifies the in-phase LO signal and couples it to a LO input port of the first mixer 112. Similarly, the quadrature LO signal can be coupled to a quadrature LO buffer amplifier 118 that amplifies the quadrature LO signal and couples it to a LO port of the second mixer 114.

The output of the first mixer 112 can be an in-phase baseband signal that is coupled to an in-phase filter 132. The in-phase filter 132 can be programmable filter whose bandwidth can be selected based on one or more control signals (not shown) provided to the receiver 100. The bandwidth of the in-phase filter 132 can be selected, for example, based on a communication standard or mode that the receiver 100 is configured to support. Therefore, where the receiver 100 is configured to support multiple standards having different channel bandwidths, the bandwidth of the in-phase filter 132 can be selected based in part on the presently supported mode.

When the signal is a baseband signal or a low IF signal, the in-phase filter 132 can be configured as a low pass filter. Alternatively, the in-phase filter 132 can be configured as a bandpass filter if the low IF signal has sufficient bandwidth to make the use of a low pass filter undesirable.

The output of the in-phase filter 132 can be coupled to a third mixer 152 configured to frequency convert the in-phase signal to a desired output IF. In one embodiment, the output of the in-phase filter 132 is a baseband signal and the third mixer is configured to upconvert the in-phase baseband signal to an output IF.

The third mixer 152 can be driven by a programmable LO that is generated in much the same manner that is used to generate the LO for the first and second mixers 112 and 114. A programmable IF LO 140 can be configured to generate a signal that is substantially four times the desired output IF. The IF LO 140 can be programmable to allow the output IF to be selected based in part on the mode supported by the receiver 100. For example, the receiver 100 can be configured to frequency convert the input signals to a predetermined IF that can depend on the manner in which the user configures the system having the receiver 100. For example, a set top box for television signals can be configured to generate an output signal at a predetermined IF, such as 70 MHz, or at a frequency corresponding to a television channel.

The output of the IF LO 140 can be coupled to a second phase shifter 142 configured as a divide by four circuit. An in-phase LO output from the second phase shifter 142 can be coupled to an in-phase buffer amplifier 156 that amplifies the in-phase LO signal and couples it to the LO input of the third mixer 152. The output of the third mixer 152 is an in-phase IF signal that is coupled to a first input of a signal combiner 160.

The quadrature signal path is configured to be substantially identical to the in-phase signal path. The two signal paths are typically substantially matched to reduce undesirable signal components that can be generated due to I and Q mismatches.

The output of the second mixer 114 can be a baseband quadrature signal that is coupled to an input of a quadrature filter 134. The quadrature filter 134 can be configured as a programmable low pass filter having programmable bandwidth. Typically, the configuration and bandwidths of the in-phase and quadrature filters 132 and 134 are the same such that the in-phase and quadrature signal paths remain substantially matched.

The output of the quadrature filter 134 can be coupled to an input of a fourth mixer 154 that is configured to upconvert the quadrature signal to the output IF. The fourth mixer 154 is driven by an LO signal that is generated by the IF LO 140. The output of the IF LO 140 is coupled to a second phase shifter 142 that generates a quadrature LO signal. The quadrature LO signal is coupled to a quadrature buffer amplifier 158 which amplifies the quadrature LO signal and couples it to an LO input of the fourth mixer 154. The output of the fourth mixer 154 can be a quadrature IF signal. The quadrature IF signal can be coupled to a second input of the signal combiner 160.

The signal combiner 160 can be configured to combine the in-phase and quadrature IF signals. The signal combiner 160 can be, for example, a signal summer that sums the in-phase IF signal with the quadrature IF signal. In one embodiment, the signal combiner 160 sums the two signals maintaining their phases. In another embodiment, the signal combiner 160 can invert one of the phases and sum the two signals. In yet another embodiment, the signal combiner 160 can generate the sum of the two signals and can invert the output signal.

The output of the signal combiner 160 represents the output IF signal. The output IF signal can be coupled to an output filter 170 that can be, for example, a low pass filter or bandpass filter that is configured to remove undesired signal products from the IF output signal. The output filter 170 can be configured as a fixed bandwidth filter or can be configured as a programmable bandwidth filter, where the bandwidth is determine, in part, based on a mode of the receiver 100.

The output of the output filter 170 can be coupled to an IF amplifier 172 that can be configured to amplify the output. The IF amplifier 172 can be a variable gain amplifier. The gain of the IF amplifier 172 can be controlled using one or more control inputs (not shown) on the receiver 100. The output of the IF amplifier 172 can be the output of the receiver 100.

The receiver 100 can also include a DC offset cancellation module 180 configured to substantially remove the DC component on each of the in-phase and quadrature signal paths. DC signals at the inputs to the third and fourth mixers 152 and 154 result in the generation of LO signals at the outputs of the respective third and fourth mixers 152 and 154. Because the LO signal represents an undesired signal, the receiver 100 can incorporate a DC offset cancellation module 180 that monitors the DC offset and compensates for it to substantially remove it from both the in-phase and quadrature signal paths prior to upconversion to the output IF.

The receiver 100 can also include an I/Q calibration module 184. The receiver 100 can reduce the contribution due to undesired signals if the in-phase (I) and quadrature (Q) signal paths can be balanced. The I/Q calibration module 184 can reduce or substantially eliminate gain differences in the I and Q signal paths and can ensure that the I and Q signal paths are substantially in quadrature.

The I/Q calibration module 184 can be coupled to one or more gain stages in each of the I and Q signal paths. In the embodiment shown in FIG. 1, the I/Q calibration module 184 is coupled to the filters 132 and 134 in the I and Q signal paths. The I/Q calibration module 184 can be configured to adjust the gain through one or more of the filters in order to balance the gains of the I and Q signal paths. Additionally, the I/Q calibration module 184 can be configured to adjust the phase offset contributed by the first phase shifter 122 in order to maintain the quadrature nature of the two signal paths.

It may be advantageous to implement the entire receiver 100 on a single integrated circuit, such that the processes and conditions used to manufacture the in-phase and quadrature signal components are closely matched, resulting in more closely matched I and Q signal paths. Additionally, it may be advantageous to implement the components on a single IC to minimize path length distances or variations that contribute to mismatches. A single IC implementation can also result in a smaller receiver 100 package.

Figure 2:
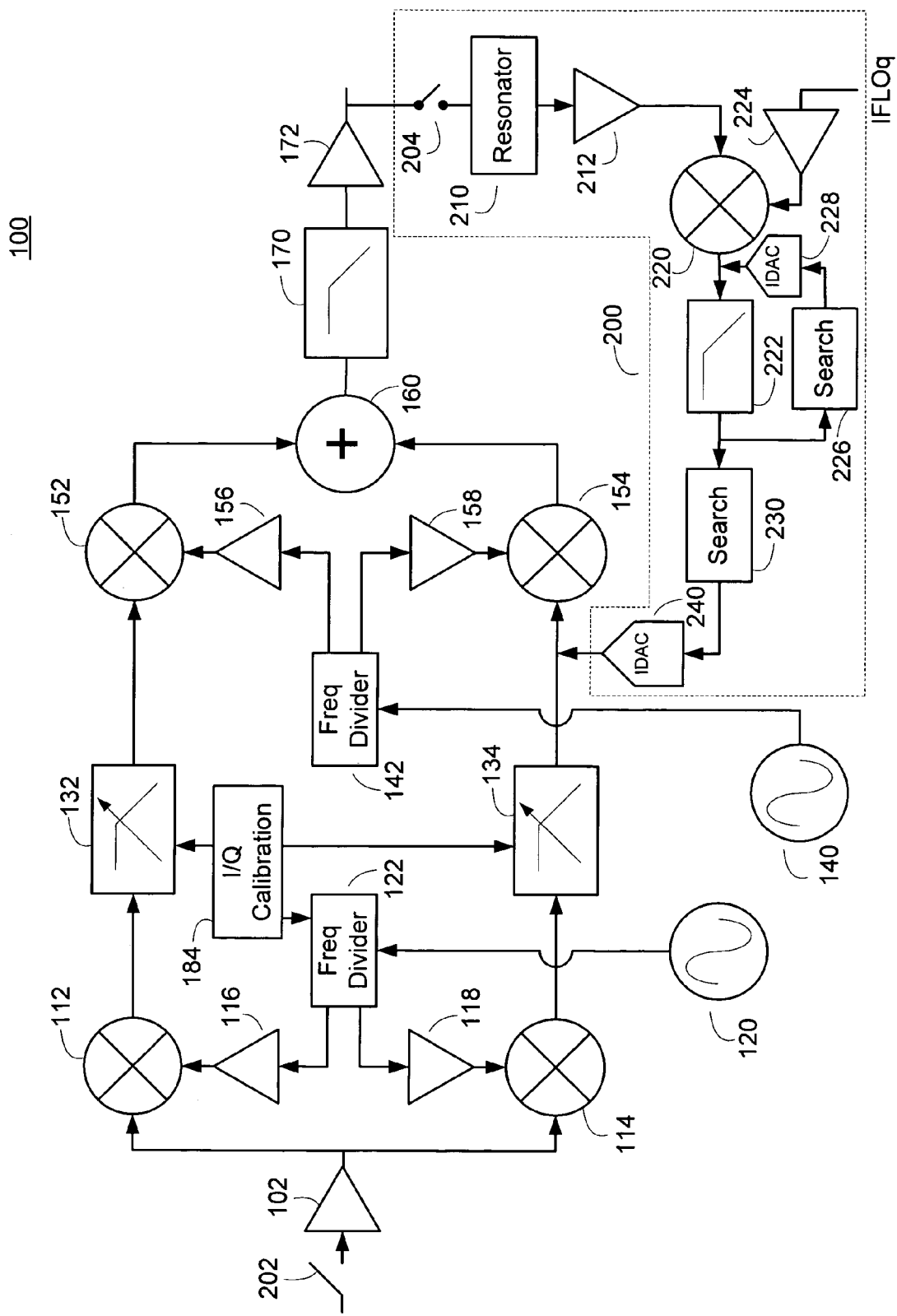
FIG. 2 is a simplified functional block diagram of an embodiment of DC offset cancellation.

FIG. 2 is a simplified functional block diagram of a receiver 100 having DC offset correction portion 200 that can be, for example, a portion of the DC cancellation module 180 shown in the receiver of FIG. 1. The DC offset correction portion 200 may also be referred to as a correlator DC offset correction portion.

The DC offset cancellation is only shown for the quadrature signal path for the sake of clarity. A similar DC offset correction portion 200 can be used to remove the DC offset in the in-phase signal path. Alternatively, as will be described below, the DC offset cancellation for the in-phase signal path can share some of the components used in the DC offset correction portion 200 that removes the DC offset from the quadrature signal path.

The DC offset correction portion 200 is not limited to use in the receiver configuration shown in FIG. 1, but may be implemented in any device in which DC offset cancellation is desirable. For example, the DC offset correction portion 200 can be used in a direct conversion receiver.

In the receiver of FIG. 1. the RF signal can be downconverted to baseband or substantially baseband. Undesirable DC offsets can be introduced by the mixers, the low pass filters, the baseband amplifiers, as well as the IF mixers. In typical semiconductor processes, each stage can add on the order of a few to several millivolts of DC offset due to device mismatches. The component DC contribution typically sets a lower bound for conventional DC offset correction techniques. Yet, high performance applications may require much lower DC offsets. The magnitude of the DC offset becomes a serious problem in modern integrated circuits where voltage supplies are constantly being reduced.

The DC offset correction portion 200 can be most easily understood by describing the operation of the DC offset correction portion 200 when configured to remove "static" DC offset errors from a signal path. Static DC offset errors refer to those DC offset errors introduced by circuit mismatches which do not change over time or which change slowly over time relative to a DC offset correction update period.

The DC offset correction portion 200 is not limited to removing static DC offset errors. The DC offset correction portion 200 may be configured to remove both static as well as dynamic DC offset errors from the signal path. The description of the operation of the DC offset correction portion 200 for use in removing both static and dynamic DC offset errors follows the description of the DC offset correction portion 200 for removal of static DC offset errors.

In the embodiment where the DC offset correction portion 200 is configured to offset static DC offset errors, the DC offset correction portion 200 can be set to an offset correction value during a calibration phase where the RF signal is disconnected from the receiver 100. The offset correction value can be maintained until a subsequent calibration period.

For example, a switch 202 can be configured to disconnect or otherwise decouple the input signal from the remainder of the receiver 100 at predetermined calibration intervals. In modern communication systems, calibration can be performed when the system is initially turned on or when channels are changed, such as in the case of television applications. Therefore, the calibration interval need not occur periodically, but may be synchronized to a typical user event, such as turn on or channel changing. In other embodiments, the calibration interval can be configured to occur at a periodic interval. In other embodiments, the calibration interval can be configured to occur in response to a user event and can be configured to occur at least once every predetermined calibration period. For example, each user event can initiate a timer, such as a watch dog timer (not shown), and the receiver can recalibrate the DC offset correction portion 200 at the expiration of the watch dog timer.

As described earlier, the receiver 100 can be configured to downconvert the received RF signals to a baseband signal and then upconvert the baseband signals to a desired output IF. DC signals appearing in the in-phase and quadrature signal paths appear at the output of the receiver as a spur at the LO frequency. This undesired IF signal component can be referred to as the "DC offset spur (DCOS)."

In the embodiment of the DC offset correction portion 200, the DCOS can be filtered from the desired output IF signal. The filtered DCOS can be amplified and converted back to a DC value. The DC value can serve as the input to a search or look up table that can be configured to generate a DC offset correction value based on the DC value. The DC correction value can then be summed or otherwise combined with the desired baseband signal to remove the DC offset.

The DC offset correction portion 200 includes a bandpass filter or resonator 210 selectively coupled to the output of the receiver 100 via a switch 204. Ideally, the resonator 210 is configured to filter the DCOS and does not have significant signal bandwidth beyond that necessary to couple the DCOS signal. The relatively narrow bandwidth of the resonator 210 can reduce the noise bandwidth of the filter, thereby reducing the effects of noise on the DC correction. Because DC offset calibration occurs during a period in which no RF signal is coupled to the receiver 100, the DC offset correction portion 200 does not couple any signal components.

In other embodiments, the resonator 210 may be a broadband resonator that couples the DCOS signal, and filtering of the DCOS signal can occur in a later stage in the DC offset correction portion 200. In some embodiments, the resonator 210 may be omitted and DCOS filtering can be performed in subsequent stages.

The output of the resonator 210 can be coupled to a DCOS amplifier 212. The DCOS amplifier 212 can be one or more amplifiers configured to amplify the DCOS signal. The DCOS amplifier 21 can have a relatively large gain in order to magnify the size of the DCOS to easily detectable levels.

The amplified DCOS signal can be coupled to a mixer 220 or some other spurious frequency converter configured to downconvert the DCOS back to a DC signal. The mixer 220 can utilize an LO signal that is phase coherent or otherwise synchronized with the LO signal used to upconvert the baseband signal to the output IF. In the embodiment shown in FIG. 2, the phase coherent LO can be generated by coupling the desired LO output from the second phase shifter 142 to a buffer amplifier 224 that drives an LO input of the mixer 220. The LO signal need not be identical in phase to the LO signal used to upconvert the baseband signal to the IF. However, it is desirable to maintain synchronization with the LO used to upconvert the baseband signal. Therefore, there may be an arbitrary fixed phase difference between the LO used with the DC offset correction portion 200 and the LO used to upconvert the baseband signal to the IF.

The DC output from the mixer can be coupled to a low pass filter 222 that can be configured to remove or otherwise significantly attenuate any undesired mixer signal components. The low pass filter can be sufficiently narrow so as to substantially attenuate frequency components other than the DCOS. In such an embodiment, the resonator 210 may be omitted. The output of the low pass filter 222 can be coupled to a search module 230.

The search module 230 can use the sign and magnitude of the DC value in a simple search algorithm to determine a correction value that compensates for the DC offset. The search module 230 can be configured, for example, to perform a binary search to determine a DC correction value. For example, the search module 230 can include a comparator that is configured to toggle between two values depending on whether the DC offset is greater or less than a predetermined threshold, such as zero volts. A binary search uses the comparator output to determine if the next increment is to a greater value or a lesser value. The binary search can continue until the search converges on a value. For example, if the search module 230 is configured to provide a 10-bit digital output, the binary search can converge in typically 11 or fewer iterations.

In another embodiment, the search module 230 can have a predetermined look up table and can look up the DC correction value based on the DC value. In the embodiment shown in FIG. 2, the search module 230 can be configured to generate a digital correction value that corrects for the DC offset level.

The digital correction value can be coupled to a current source digital to analog converter (IDAC) 240 that is configured to drive the baseband signal path with a current that cancels the DC offset on the signal path. By using the IDAC 240, the correction value can be driven directly to the signal path without additional components. In an alternative embodiment, the DAC can be a voltage DAC and the DC offset correction can be coupled to the baseband signal path using a signal summer. The reference current or voltage and the number of bits in the DAC establish the range and sensitivity of the DAC output.

The DC offset correction portion 200 can also include an inner search module 226 and IDAC 228 that is configured to correct for the DC offset error attributable to the DC offset correction portion 200 itself. The value of DC offset error attributable to the DC offset correction portion 200 can be removed in a calibration period distinct from the calibration period in which static DC offset errors are removed from the signal path.

To compensate for DC offset errors attributable to the DC offset correction portion 200, the switch 204 can be opened to decoupled the DC offset correction portion 200 from the output of the receiver 100. Then, the inner search module 226 can perform a binary search on the DC offset error appearing at the output of the filter 222 with no signal input to the DC offset correction portion 200. A binary output signal from the inner search module 226 can be coupled to an inner IDAC 228 that couples the compensation signal to the input of the filter 222. The binary output from the inner search module 226 can then be maintained to correct the DC offset contribution from the DC offset correction portion 200. The calibration using the inner search module 226 can be repeated periodically or at some known intervals to update the compensation value. For example, in a static DC offset correction embodiment, the inner search module 226 can be updated prior to each time that the DC offset correction portion 200 is updated. The switch 204 can then be closed to allow the DC offset correction portion 200 to function.

Therefore, the DC offset correction portion 200 can be configured to be set to a compensation value during a calibration period in which the RF input signal is decoupled from the receiver 100, such as by a opening a switch 202. The value of the DC offset correction can be maintained until the next calibration period. During calibration, the filters 132 and 134 within the receiver 100 can be configured to operate at reduced bandwidths to limit the amount of thermal and other noise present with the DC offset when it is upconverted.

The in-phase signal path can include a similar DC offset correction portion 200. In one embodiment, the DC offset correction portion 200 is duplicated for the in-phase signal path, with the mixer 224 driven by an LO signal that is phase coherent with the in-phase LO signal. The IDAC 240 for the in-phase signal path would, of course, be configured to drive the in-phase signal path.

In another embodiment, the DC offset correction portions for the in-phase and quadrature signal paths can share one or more elements or parts of elements. For example, the resonator 212 and DCOS amplifier 212 can be shared by the in-phase and quadrature DC offset correction portions, because the signals processed by these elements are composite signals not dedicated to either in-phase or quadrature signals. In another embodiment, the DCOS amplifier 212 can include multiple stages and a final stage can include two parallel amplifier stages, one driving the quadrature correction path and the other driving the in-phase correction path.

The DC offset correction portion illustrated in FIG. 2 is described in a configuration for compensating for static DC offset errors. There may also be dynamic DC offset errors that vary at a rate that is faster than the static DC correction interval. Additionally, the dynamic DC offset errors may be based on undesired signal components that are included with the RF signals, and the DC error may only be present when the RF signal is present.

The DC offset correction portion 200 can be operated to compensate for both static and dynamic DC offset errors in the signal path. The operation of the DC offset correction portion 200 is very similar to the operation when configured for static DC offset error correction. However, there is no need to calibrate the DC offset correction portion 200 during a period in which the receiver 100 is decoupled from the RF input. The switch 202 at the input to the receiver 100 can be omitted in such a configuration.

To compensate for both static and dynamic DC offset errors, the DC offset correction portion 200 can initially be decoupled from the receiver 100 output by opening switch 204. The DC offset error attributable to the DC offset correction portion 200 can be removed using the inner search module 226 and the inner DAC 228. After compensating for the internal DC offset errors, the switch 204 can be closed to couple the DC offset correction portion 200 to the output of the receiver 100.

The filter 134 bandwidth can be set to the desired channel bandwidth because there is no calibration period and the DC offset correction portion 200 operates while the receiver 100 is in operation. The filter 222 within the DC offset correction portion 200 can be designed to have a sufficiently narrow bandwidth such that the presence of signal components in the DC offset correction portion 200 do not significantly affect the DC offset compensation.

The search module 230 and associated IDAC 240 continue to be updated to remove the DC offset error occurring on the signal path. Instead of freezing the value of the IDAC 240 following a calibration period, the search module 230 and IDAC 240 are allowed to update to track any deviations in the DC offset error appearing on the signal path.

Figure 3:
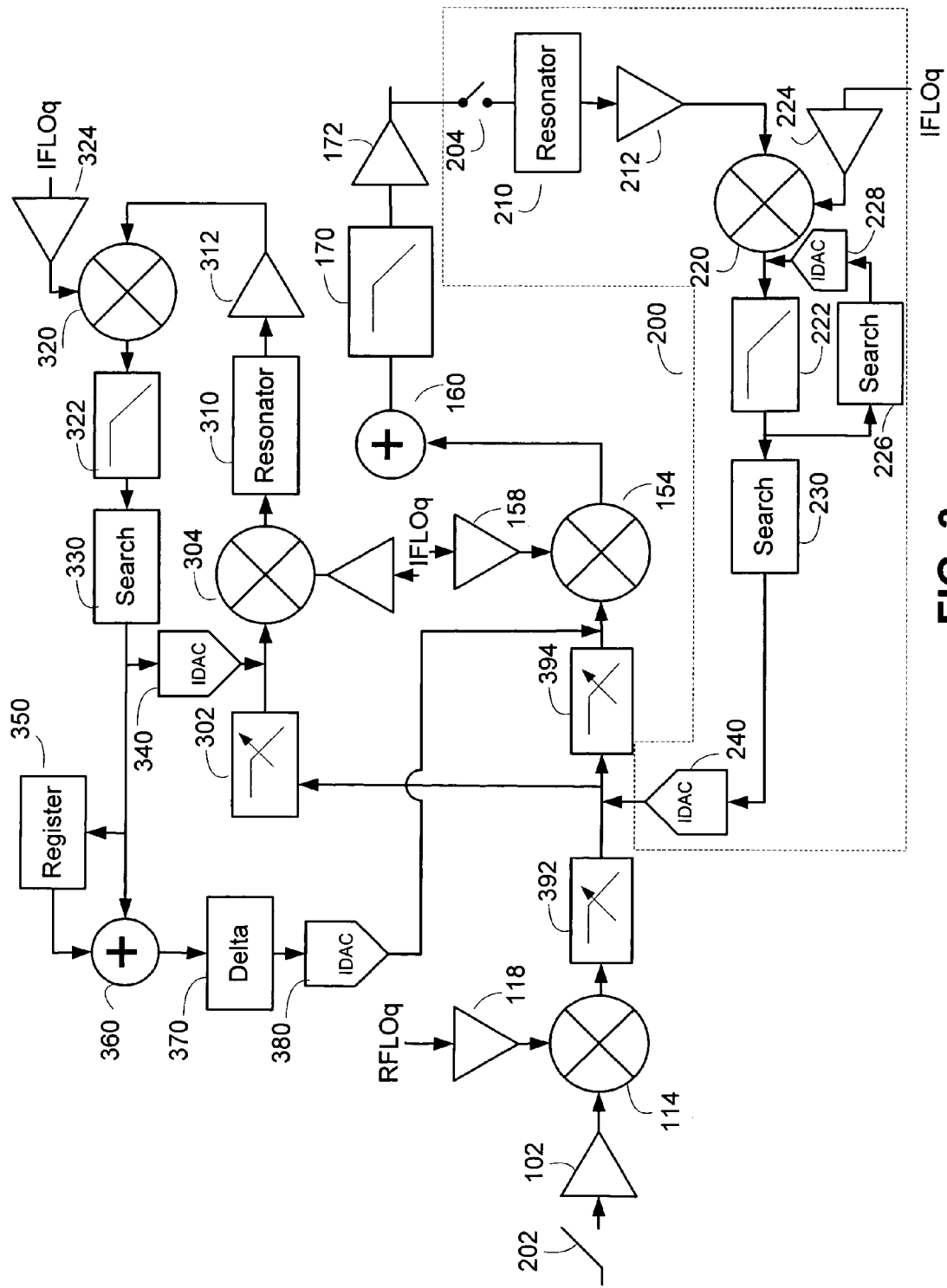
FIG. 3 is a simplified functional block diagram of an embodiment of DC offset cancellation.

FIG. 3 is a simplified functional block diagram illustrating the quadrature portion of a receiver, such as the receiver of FIG. 1. The quadrature portion of the receiver also includes two separate DC offset correction portions. The two DC offset correction portions include a static DC offset correction portion, using, for example, the DC offset correction portion shown in FIG. 2 for this purpose, and a dynamic DC offset correction portion. As before, DC offset correction of the quadrature signal path is shown for the sake of clarity. The in-phase signal path can use a similar combination of static and dynamic DC offset correction.

In the simplified functional block diagram of FIG. 3, the quadrature signal path is similar to that shown in the receiver of FIG. 1. However, the baseband quadrature filter of FIG. 1 can be divided into two separate baseband quadrature filters 392 and 394. The combination of the two separate baseband quadrature filters 392 and 394 can be configured to provide the same or similar response to the quadrature filter shown in the receiver of FIG. 1. In one embodiment, the first quadrature filter 392 can have a frequency response and gain that substantially matches the frequency response and gain of the quadrature filter of the embodiments of FIGS. 1 and 2. The second quadrature filter 394 can be configured to contribute relatively little to the quadrature channel selection.

The static DC offset portion 200 can be configured to operate as described in FIG. 2. The only difference between the DC offset portion 200 shown in FIG. 3 and the similar portion shown in FIG. 2 is a that the IDAC 240 drives a location in the quadrature signal path between the first and second quadrature filters 392 and 394.

The dynamic DC offset correction portion can include an inner loop that can be configured to remove static DC offset contribution attributable to elements within the dynamic DC offset correction portion. The dynamic DC offset correction portion can also include elements in an outer loop that track the dynamic DC offset and compensate for the dynamic DC offset.

The dynamic DC offset correction portion includes a low pass filter 302 having an input coupled to the portion of the quadrature signal path between the first and second quadrature filters 392 and 394. In one embodiment, the frequency response of the low pass filter 302 can be configured to be static and relatively narrow. For example, a suitable value for a low pass corner frequency for practical applications can be approximately 1 kHz. The low pass filter 302 can be implemented by digital or analog means without special techniques. The low pass filter 302 filters out most of the signal power, leaving the DCOS to be the dominant signal present from a power spectral density standpoint.

In a separate embodiment, the frequency response of the low pass filter 302 can be configured to be substantially the same as the frequency response of the second quadrature filter 394.

The output of the low pass filter 302 can be coupled to an input of a mixer 304 configured to frequency convert the baseband quadrature signal to the output IF. The LO input of the mixer 304 can be driven by an LO signal that is phase coherent with the quadrature LO signal. The quadrature LO signal can be coupled to a buffer amplifier 306 that drives the LO input of the mixer 304. The mixer 304 and buffer amplifier 306 can be configured to be matched to the mixer 154 and buffer 158 used to upconvert the quadrature signal to the output IF.

Therefore, the output of the mixer 304 substantially matches the quadrature IF output from the mixer 154 in the quadrature signal path. The dynamic DC offset correction portion then includes an inner loop that is configured similar to the static DC offset correction portion and can be configured to substantially remove the static DC offset error due to the mismatch between the second quadrature filter 394 and mixer 154 in the quadrature signal path relative to the low pass filter 302 and mixer 304 in the dynamic DC offset correction portion. This difference $\Delta Vos$ is expected to be small because these components can be designed to be well matched.

A resonator 310 couples the DCOS from the mixer 304 to a DCOS amplifier 312 that amplifies the DCOS. A second mixer 320 can be configured to downconvert the amplified DCOS back to a DC signal. The second mixer 320 can use an LO that is phase coherent with the LO signal used to upconvert the DC offset to the output IF. For example, the quadrature LO signal can be coupled to a buffer amplifier 324 that drives the LO input of the second mixer 320.

The output of the second mixer 320 can be coupled to a low pass filter 322 configured to pass the DC error component. The output of the low pass filter 322 can be coupled to a search module 330 that can be configured to generate a correction value based on a binary search of a table or curve having DC correction values. The output of the search module 330 can be coupled to a current source digital to analog converter (IDAC) 340 that is configured to remove the DC offset from the dynamic DC offset correction portion that is attributable to mismatch in the offset correction circuit.

The output of the search module 330 is coupled to a non-inverting input of a signal summer 360. The binary value output from the search module 330 can be stored in a register 350. The register 350 thus stores the binary value needed to compensate for static DC offset values attributable to the compensation module.

The output of the register 350 can be coupled to an inverting input of the signal summer 360. The difference between the outputs of the first search module 330 and the register 350 is generated and output by the signal summer 360. The value represents the dynamic DC offset error.

The output from the signal summer 360 can be coupled to a delta offset module 370 that is configured to perform a search of a correction value for the dynamic DC offset error. The output of the delta module 360 is coupled to an IDAC 380 that is configured to drive the quadrature signal path at the output of the second quadrature filter 394 to correct the dynamic DC offset error.

The dynamic DC offset correction portion can be calibrated initially at the same time that the static DC offset correction portion 200 is calibrated. During calibration, the switch 202 is opened and no RF signal is coupled to the receiver. The static DC offset correction portion 200 generates the static DC offset correction value as discussed in FIG. 2. The inner loop of the dynamic DC offset correction portion generates a static correction corresponding to the DC offset error attributable to a mismatch in circuit elements. The dynamic DC offset correction portion also generates a static DC offset correction, using the second search module 350, that is substantially the same as that generated by the search module 230 in the static DC offset correction portion 200.

After calibration, the static correction values remain fixed, and the switch 202 can be closed to couple the RF signal to the receiver. The delta module 370 then continues to track the dynamic DC offset error by determining the differences between the monitored DC offset and the DC offset under the static calibration conditions. The delta module 370 generates a corresponding correction value that is transformed to a current by the IDAC 380 and driven onto the quadrature signal path to remove the dynamic DC offset error.

Similar DC offset correction techniques can be applied if, for example, the upconversion takes place in the digital domain. In this case, the IDACs are not required and matching is typically not a problem. After calibration, a single dynamic DC offset correction portion signal processing loop can be used to remove DC offset from the signal path. The drawback of the digital domain implementation is that it is typically not compatible with existing systems since it requires modification in the demodulator circuits. The digital implementation also typically requires a high resolution high speed video ADC to preserve dynamic range of the system.

Figure 4:
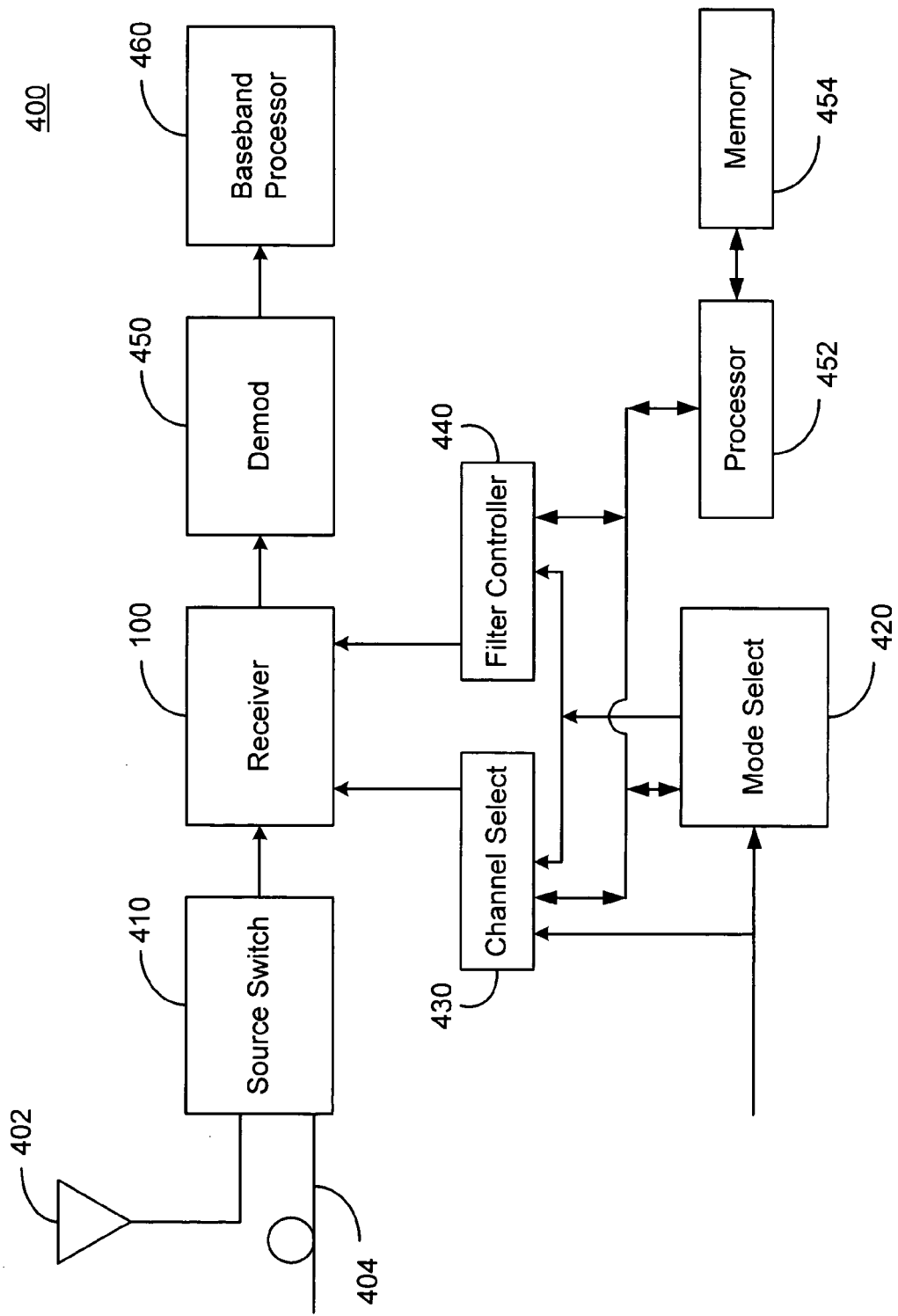
FIG. 4 is a simplified functional block diagram of a receiver in a system.

FIG. 4 is a simplified functional block diagram of a receiver 100 in a system 400. The following description describes an embodiment in which the system 400 is a television receiver. However, the system 400 can be any of a plurality of systems. For example, the system 400 can be a television, television receiver, set top box, or television tuner integrated within a video recorder or some other television receiver. In other embodiments, the system 400 can be a radio receiver, wireless transceiver, telephone receiver, cellular telephone, cordless telephone, or some other communication device.

The system 400 can include a source switch 410 that can be coupled to one or more signal sources. For example, a first source input can be coupled to an antenna 402 and a second source input can be coupled to a wired source, such as a cable coupled to a cable television distributor. The source switch 410 is not limited to coupling only one type of signal to the receiver 100. For example, the source switch 410 can be coupled to a television signal source, for example, via the antenna 402, and can be coupled to a radio source, for example, via the cable 404.

The source switch 410 can be configured to couple any one of the signals from any signal source to the input of the receiver 100. The receiver 100 can be, for example, the receiver of FIG. 1 and can include the DC offset correction as shown in FIGS. 2 and 3.

The receiver 100 can receive the RF signal from the source switch 410 and can downconvert the signal to an output IF. The output IF from the receiver 100 can be coupled to a demodulator 450 and from the demodulator 450 to a baseband processor 460. In one embodiment, the demodulator 450 can be configured to demodulate a television signal at a predetermined IF. The demodulated television signals are communicated to a baseband processor 460 that can be configured, for example, to format the signals into video and audio signals for corresponding video and audio output devices (not shown).

The system 400 can also include a mode selection module 420 that can be configured to receive a mode selection input from an external source (not shown) that can be, for example, a user selection or user control. The mode can correspond to an operating mode of the receiver 100, and can be used to determine a particular operating band, channel spacing, channel bandwidths, and output IF frequency.

The mode select module 420 can be coupled to a channel select module 430. The channel select module 430 can be coupled to the mode select module 420 and can be configured to generate the desired LO control signals. The channel select module 430 can generate the control signals needed to tune the LO frequencies of the receiver to enable reception of the desired RF signal and generation of the desired output IF. The channel select module 430 can also receive one or more input signals from an external source (not shown), such as a user interface or some other module or device that can indicate a desired channel selection.

The channel select module 430 can independently control the RF and IF LOs within the receiver 100. For example, the channel select module 430 can tune the RF LO to a frequency that is based on both a mode and a desired channel. The channel select module 430 can also be configured to control the frequency of the IF LO and may be configured to control the IF LO based only on the desired mode. In other embodiments, the channel select module 430 can be configured to tune both the RF and LO frequencies for each channel.

The channel select module 430 can also be configured to control the DC offset calibration of the receiver 100. For example, the channel select module 430 can control an RF switch within the receiver 100 and can initiate the DC offset calibration. In another embodiment, a calibration module 412 within the receiver 100 can receive the channel select signals and the filter control signals and can initiate DC offset calibration, including controlling the RF switch and filter bandwidths during the duration of the DC offset calibration.

A filter controller 440 can also be coupled to the mode select module 420. The filter controller 440 can be configured to provide the control signals to the receiver 100 that control the filter bandwidths. The filter controller 440 can be configured to set the filter bandwidths based on the channel selectivity required in the receiver 100, which can depend on the operating mode.

The filter controller 440 can also be in communication with the channel select module 430. The filter controller 440 can be configured to control the filters within the receiver 100 to predetermined bandwidths for a predetermined calibration duration following each channel change. For example, the filter controller 440 can be configured to tune the filters to a minimal bandwidth during DC offset calibration. Alternatively, as discussed above, the calibration module 412 within the receiver 100 can be configured to control the filter bandwidths during the calibration duration.

A processor 452 and associated memory 454 can be included within the system 400 can be configured to perform one or more functions within each of the modules. For example, the memory 454 can include one or more processor 452 usable instructions in the form of software that can, when executed by the processor 452, perform some or all of the functions of the various modules within the system 400.

Figure 5:
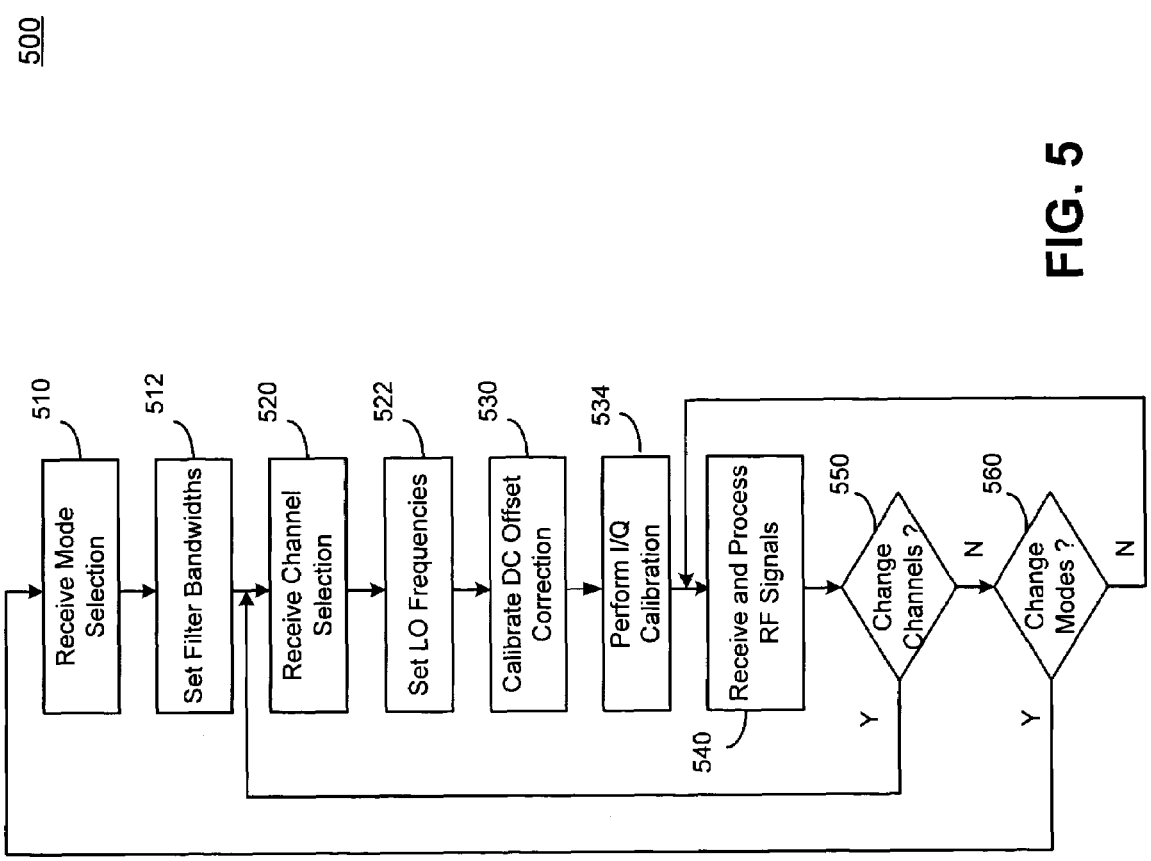
FIG. 5 is a simplified flowchart of a method of receiving a signal in a communication system.

FIG. 5 is a simplified flowchart of a method 500 of receiving a signal in a communication system. The method 500 can be performed, for example, by the receiver shown in FIG. 1 with the DC offset correction shown in either FIG. 2 or FIG. 3.

The method 500 begins at block 510 where the receiver initially receives a mode selection. the receiver can be configured to operate in a plurality of modes, and each mode can have corresponding operating frequencies, channel spacings, output IF requirements, as well as other configurable parameters. The receiver can receive the mode selection as one or more binary bits that can be supplied across a bus.

The receiver proceeds to block 512 and can set the filter bandwidths based in part on the mode selected. In another embodiment, the receive can independently receive filter control signals that control the filter bandwidths and other controllable filter parameters.

The receiver then proceeds to block 520 and receives channel selection information. The channel selection information can include one or more control signals that control the LO frequencies within the receiver in conjunction with the mode selection. The receiver proceeds to block 522 and sets the LO frequencies based on the received channel selection information.

In the embodiment shown in FIG. 5, the receiver can be configured to calibrate the DC offset correction portions following each channel selection. Thus, after the filter bandwidths and LO frequencies are determined, the receiver can proceed to block 530 and calibrate the DC offset correction. When the receiver includes separate I and Q signal paths, the receiver can simultaneously calibrate the DC offset correction for each of the signal paths. Alternatively, the receiver can calibrate the DC offset correction for the multiple signal paths during distinct calibration periods or in partially overlapping periods. DC offset calibration can refer to determining a static DC offset error, calibrating an inner loop within a DC offset correction portion, or both.

In some embodiments, only the calibration of the inner loop within a DC offset correction portion is performed. In other embodiments, where a distinct static offset compensation portion is utilized, the receiver may calibrate both the inner loop and the static DC offset compensation portion.

After calibrating DC offset correction, the receiver proceeds to block 534 and performs I/Q calibration. As noted earlier, the performance of the receiver can be adversely affected by mismatches in gain and phase. Therefore, the receiver can substantially match the gains of the I and Q signal paths and can adjust any phases offsets to ensure that the I and Q signal paths remain substantially in quadrature.

The receiver proceeds to block 540 and receives the RF signal and processes the signal to the output IF. For example, the receiver can downconvert the RF signal to baseband in-phase (I) and quadrature (Q) signals. The receiver can filter the I and Q signals and then upconvert them to output IF frequencies. The I and Q IF frequencies can then be combined into an output IF signal.

The receiver can periodically proceed to decision block 550 to determine if a command to change the channel is received. If a new channel is selected, the receiver proceeds back to block 520 to process the new channel selection.

If, at decision block 550, the receiver does not receive a new channel selection, the receiver proceeds to decision block 560 to determine if a new mode is selected. If a new mode is selected, the receiver can proceed back to block 510 to process the new mode selection. If instead, the receiver has not received a new mode selection, the receiver proceeds back to block 540 and continues to process the received RF signals in the manner presently configured.

Figure 6A:
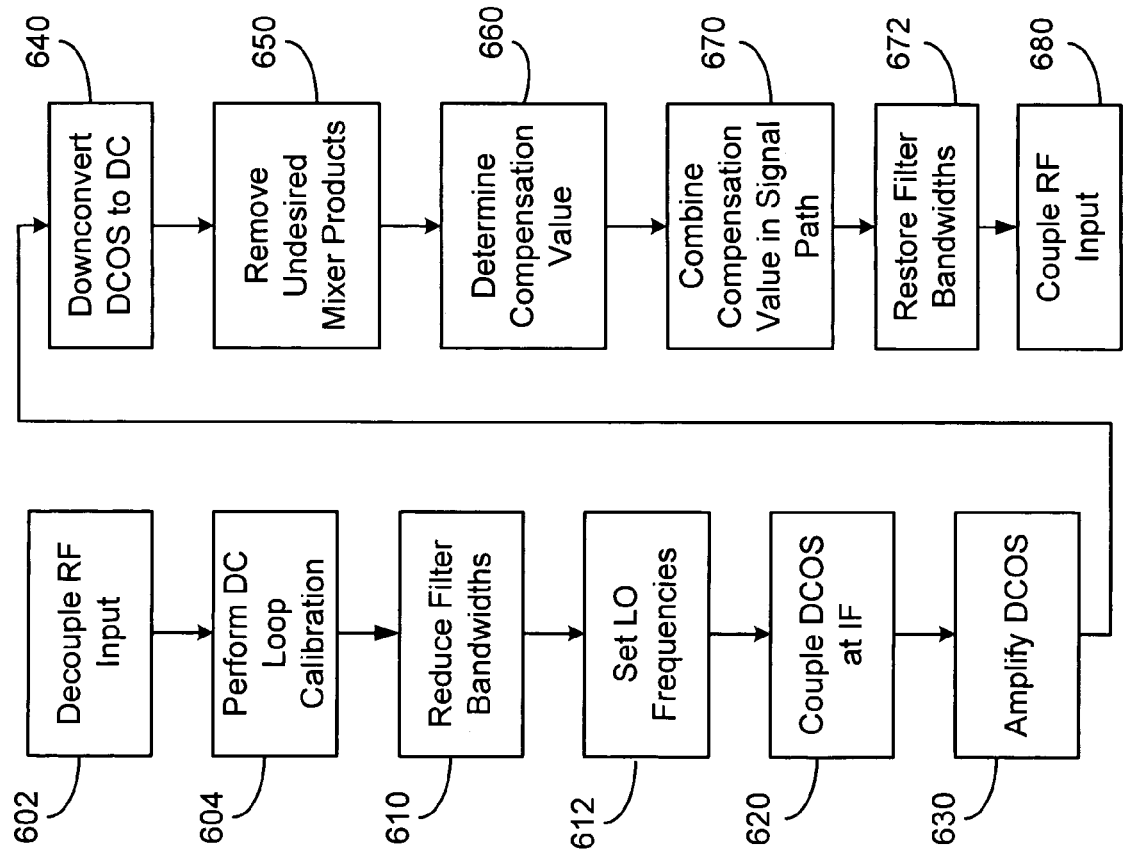
FIGS. 6A-6B are simplified flowcharts of embodiments of methods of DC offset correction calibration.

FIG. 6A is a simplified flowchart of a method 530 of calibrating a DC offset correction portion, such as the static DC offset correction portion shown in FIG. 2. The calibration can be performed by the calibration module in a receiver in conjunction with the DC offset correction portion. The calibration of a single DC offset correction portion is described, although the receiver can include multiple DC offset correction portions to correct the DC offset errors corresponding to multiple signal paths.

The method 530 begins at block 602 with the calibration module initially decoupling the RF input signal from the reminder of the receiver. Because the majority of the DC offset error can be attributable to mismatches within the receiver, the RF input signal is not used during calibration. The calibration module can, for example, open a switch at the input to the receiver to decouple the RF signal from the receiver.

The calibration module can proceed to block 604 and perform a DC loop calibration. The calibration module can, for example, calibrate the DC offset compensation modules to correct for the DC offset errors attributable to the compensation modules. For example, in the embodiment of FIG. 2, the calibration module can calibrate the correction circuit using the inner search module and inner DAC.

The calibration module can then proceed to block 610 and reduce the filter bandwidths within the receiver. The calibration module can reduce the filter bandwidths to reduce the noise bandwidths of the filters and reduce the effects of thermal noise and any other noise that is related to filter bandwidth.

The DC offset correction portion can then couple the DC offset spur (DCOS) appearing at the IF output. For example, the DC offset correction portion can use a bandpass filter or a resonator tuned to the DCOS to couple the DCOS and substantially reject any other signals and noise that may be present at the output IF.

The DC offset correction portion then proceeds to block 630 and amplifies the DCOS signal to facilitate detection. The DC offset correction portion can amplify the DCOS signal with a relatively large gain to amplify incremental changes in the DC offset error signal.

After amplifying the DCOS, the DC offset correction portion can proceed to block 640 and downconvert the DCOS to a DC signal. In one embodiment, the DC offset correction portion can use an LO signal that is phase coherent with the LO signal used to upconvert baseband signals in the receiver to the output IF.

The DC offset correction portion proceeds to block 650 and removes undesired mixer products. Because the DC offset correction portion is configured to operate on the DC signal component, the reminder of the signal components can be removed or otherwise attenuated using a filter, such as a low pass filter. In particular, undesired mixer products such as the signals located at the sum of the DCOS with the LO frequency can be removed using a low pass filter.

The DC offset correction portion can then proceed to block 660 and determine the compensation value. In one embodiment, the DC offset correction portion can perform a search, such as a binary search, based on the sign and magnitude of the DC signal to determine a correction value. The DC offset correction portion can generate, for example, a digital value corresponding to the correction value.

Figure 6B:
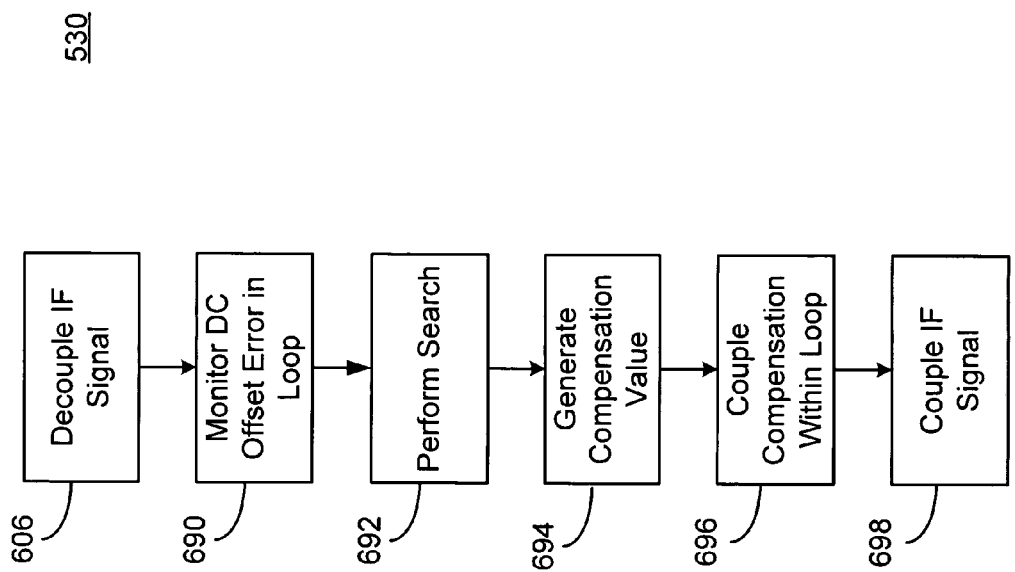

FIG. 6B is a simplified flowchart of another embodiment of a method 530 of calibrating a DC offset correction portion, such as the DC offset correction portion shown in FIG. 2. The method 530 of calibrating the DC offset correction portion can be performed, for example, when the DC offset correction portion is used to remove both static and dynamic DC offset errors.

The method 530 begins at block 606 where the DC offset correction portion is initially decoupled from the IF signal. In the receiver embodiment shown in FIG. 2, this can be performed by opening switch 204.

The DC offset correction portion proceeds to block 690 and monitors the DC offset error in the loop. The DC offset error within the loop can be monitored, for example, by sampling the signal at the output of the filter 222 shown in FIG. 2. The DC offset error appearing at this node represents the DC offset error contributed by the DC offset correction portion, because the signal processing elements of the receiver are decoupled from the DC offset correction portion.

After monitoring the DC offset error in the loop, the DC offset correction portion proceeds to block 692 and can perform a search based on the value of DC offset error. The inner search module 226 can perform, for example, a binary search on the DC offset error. An example of performing a binary search is presented earlier in relation to the description of FIG. 2.

After performing the search, the DC offset correction portion proceeds to block 694 and generates a compensation value based on the search results. The IDAC 228 of FIG. 2 can, for example, generate a current based on the results of the search. The DC offset correction portion proceeds to block 696 and couples the compensation value to the loop. In the embodiment of FIG. 2, the IDAC 228 sources a current at the input to the filter 222. The binary search can converge on the value that substantially removes the DC offset error attributable to the loop. Once the binary search converges and the compensation value is coupled to the loop, the calibration of the loop is effectively complete.

The IF signal is coupled to the DC offset correction portion in block 698 and the calibration is complete. The receiver can then operate with the DC offset correction portion coupled to and monitoring the IF output from the receiver. The DC offset correction portion can then remove the DC offset correction in the manner previously described in relation to FIG. 2. In short, the DC offset correction portion can perform a search that converges on the DC offset error appearing on the signal path and can continue to modify the search output by one least significant bit to compensate or otherwise remove changes in the DC offset error.

The DC offset correction portion can proceed to block 670 and can combine the offset correction with the signal path. For example, the digital value corresponding to the correction value can be coupled to a DAC, such as a current source DAC. The current source DAC can be configured to drive the signal path in the receiver that with the current corresponding to the correction value to compensate for the static DC offset error in the signal path. In another embodiment, the digital value can be coupled to a voltage output DAC, and the voltage output from the DAC can be summed with the signal value in the signal path being corrected. The signal path being corrected can be, for example, the baseband I or Q signal paths in the receiver.

After coupling the compensation value to the signal path, the DC offset correction portion proceeds to block 672 and restores or otherwise sets the bandwidths of the filters to the desired signal bandwidth for signal processing.

The DC offset correction portion proceeds to block 680 and the calibration module can couple the RF signal to the receiver. The static DC offset correction is complete and can be updated periodically or based on some system event, such as a channel selection or turn on.

Figure 7:
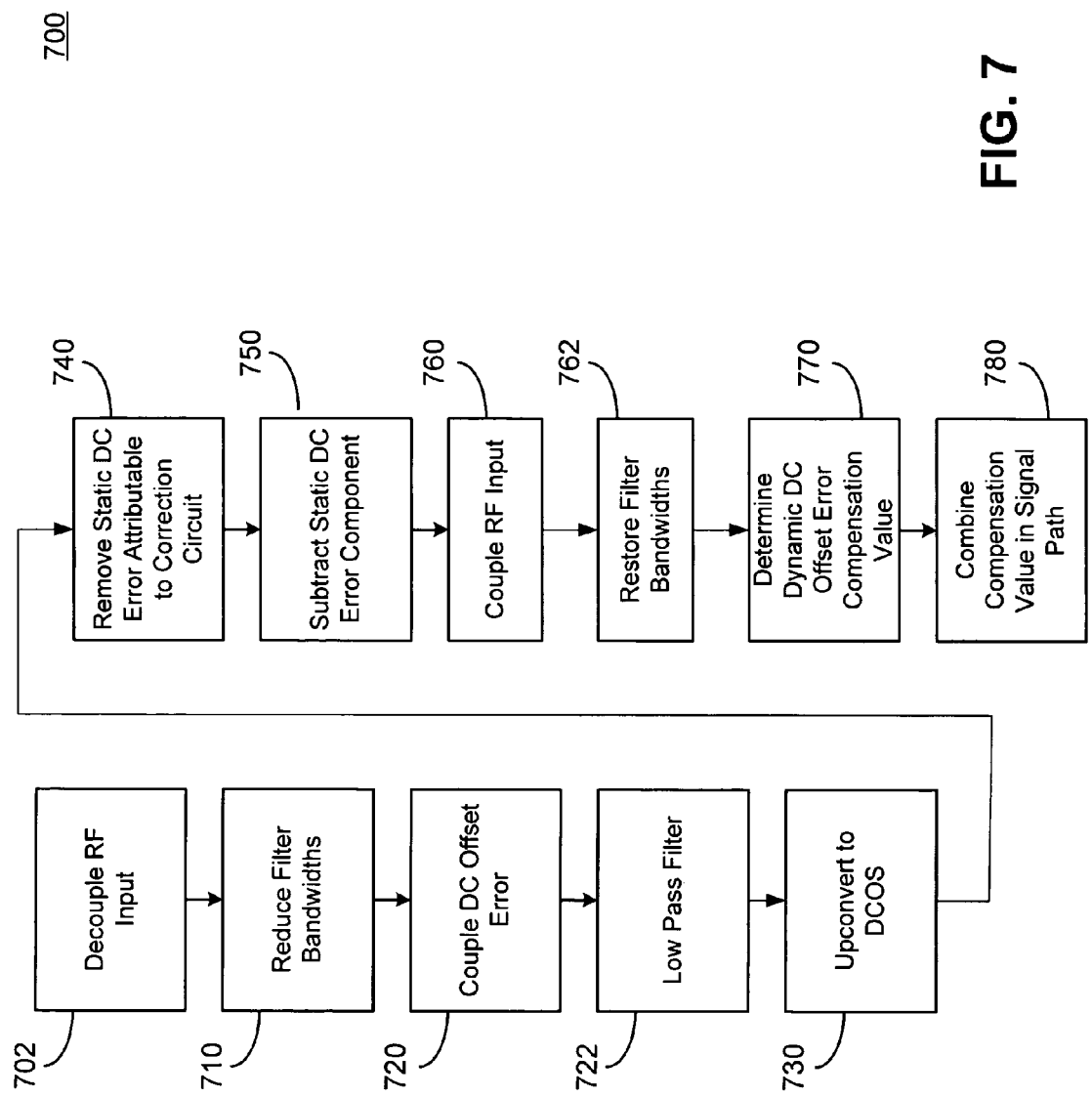
FIG. 7 is a simplified flowchart of a method of DC offset correction.

FIG. 7 is a simplified flowchart of an embodiment of a method 700 of correcting for dynamic DC offset errors in a receiver. The method 700 includes a calibration portion and a monitoring and correction portion. The calibration portion can be performed in the calibration step of the method of FIG. 5 and the monitoring and correction portion can be performed during the RF processing step of the method of FIG. 5. The method 700 can be duplicated for each of multiple signal paths in the receiver. For example, the method 700 can be duplicated for the in-phase and quadrature signal paths of a receiver, such as the receiver of FIG. 1.

The method 700 can be performed by the receiver of FIG. 1 or FIG. 4 in conjunction with the DC offset correction portion shown in FIG. 3. The method 700 begins with a calibration portion, where the DC offset correction portion is calibrated in a manner similar to the calibration of the static DC offset correction portion.

The calibration portion begins at block 702 where the receiver decouples the RF signal from the receiver input. As shown in FIGS. 2 and 3, a switch can be used to decouple the RF signal from the receiver RF input. The receiver can then proceed to block 710 and reduce the filter bandwidths to predefined bandwidths used during calibration.

The receiver proceeds to block 720 and couples the DC offset error to the DC offset correction portion. For example, in the receiver of FIG. 3, the DC offset error appearing in the quadrature baseband signal path is coupled to the DC offset correction portion.

The receiver proceeds to block 722 and filters the DC offset error. The receiver can, for example, low pass filter the DC offset error in a filter that is part of the DC offset correction portion.

The receiver can then proceed to block 730 and upconvert the DC offset error to the DCOS at the IF. In one embodiment, the receiver can upconvert the DC offset error using a mixer driven by the same LO as used to upconvert the baseband signal to an output IF. For example, the receiver can upconvert the DC offset error tot DCOS using a phase coherent copy of the IF LO.

The receiver then proceeds to block 740 and removes a static DC offset error attributable to the DC offset correction portion, or at least a subset of elements from the DC offset correction portion. For example, the low pass filter and mixer in the DC offset correction portion can be fairly closely matched to the filter and mixer in the signal path. However, the match will not likely be perfect, and the mismatch will result in a small DC offset error appearing in the DC offset correction portion.

The DC offset correction portion can remove the DC offset error attributable to the correction circuit using a loop that is similar to the loop used for the static DC offset compensation in the signal path. The main difference is that the loop couples the DCOS at the mixer output within the DC offset correction portion.

The receiver proceeds to block 750 and subtracts the static DC offset error from a composite error value determined in the DC offset correction portion. The difference between the composite DC error and the static DC offset error can be attributable to the dynamic DC offset error. At this point, the calibration of the dynamic DC offset correction portion is complete.

To monitor and correct for the dynamic DC offset error, the receiver proceeds to block 760 and couples the RF signal to the RF input of the receiver. The receiver then proceeds to block 762 and restores or otherwise sets the filter bandwidths to the bandwidths used during signal processing.

The receiver proceeds to block 770 and the DC offset correction portion determines the dynamic DC offset error compensation based on the difference between the composite DC offset error and the static DC offset error. The receiver, can use a search that determines a compensation value, such as a digital compensation value that corresponds to the dynamic DC offset error.

The receiver proceeds to block 780 and the DC offset correction portion can then combine the compensation value in the signal path to correct for the dynamic DC offset error. In one embodiment, the DC offset correction portion uses a current DAC that receives the digital compensation value and produces a current that drives the signal path to compensate for the dynamic DC offset value.

A method and apparatus for receiving an RF signal and downconverting a selected channel to a selectable IF is disclosed. A programmable RF LO can be tuned to an RF frequency. A phase shifter can generate an in-phase RF LO and a quadrature RF LO. The RF LO signals in quadrature can be used to frequency convert a desired RF signal to in-phase and quadrature baseband signals.

Programmable filters in each of the in-phase and quadrature baseband signal paths can be set to a desired bandwidth to achieve a desired channel selection. A DC offset correction module can operate on the in-phase and quadrature baseband signal paths to substantially remove the DC offset errors appearing on the signal paths.

A programmable IF LO can be tuned to frequency convert the in-phase and quadrature baseband signals to in-phase and quadrature output IF signals, respectively. A phase shifter can generate an in-phase IF LO and a quadrature IF LO that are used to drive frequency converters, such as mixers, to upconvert the baseband signals to output IF signals.

A signal combiner, such as a signal summer, can combine the in-phase and quadrature output IF signals into a composite output IF signal.

A static DC offset correction portion can be configured to substantially compensate for static DC offset errors. A dynamic DC offset correction portion can be used to track dynamic DC offset errors in the baseband signal paths and substantially compensate for the dynamic DC offset errors.

The receiver can be produced on a single IC. Such an implementation allows the various elements to be better matched that is generally possible using discrete elements or multiple ICs. The ability to closely match the elements of the receiver can reduce the level of DC offset error that can be attributable to element mismatches.

The steps of a method, process, or algorithm described in connection with the embodiments disclosed herein may be embodied directly in hardware, in a software module executed by a processor, or in a combination of the two. The various steps or acts in a method or process may be performed in the order shown, or may be performed in another order. Additionally, one or more process or method steps may be omitted or one or more process or method steps may be added to the methods and processes. An additional step, block, or action may be added in the beginning, end, or intervening existing elements of the methods and processes.

The above description of the disclosed embodiments is provided to enable any person of ordinary skill in the art to make or use the disclosure. Various modifications to these embodiments will be readily apparent to those of ordinary skill in the art, and the generic principles defined herein may be applied to other embodiments without departing from the spirit or scope of the disclosure. Thus, the disclosure is not intended to be limited to the embodiments shown herein but is to be accorded the widest scope consistent with the principles and novel features disclosed herein.

What is claimed is:

1. A method of canceling a DC offset error in a signal path of a receiver, the method comprising:

frequency converting the DC offset error to a DC offset spurious signal (DCOS);

amplifying the DCOS signal to generate an amplified DCOS signal;

frequency converting the amplified DCOS signal to a baseband signal;

determining a DC offset correction value based on the baseband signal; and providing a DC correction to the signal path based on the DC offset correction value, wherein frequency converting the amplified DCOS signal to the baseband signal comprises mixing the amplified DCOS signal with a Local Oscillator (LO) signal that is synchronized with a LO signal used to frequency convert the DC offset error to the DCOS signal.

2. The method of claim 1, further comprising:

decoupling an RF signal from the receiver prior to determining the DC offset correction value; and coupling the RF signal to the receiver while providing the DC correction to the signal path.

3. The method of claim 1, wherein determining the DC offset correction value comprises performing a search of a list of correction values based on a DC value within the baseband signal.

4. The method of claim 1, wherein determining the DC offset correction value comprises determining a digital correction value by performing a binary search based on the baseband signal.

5. The method of claim 1, wherein providing the DC correction to the signal path comprises providing a current to the signal path, the value of the current based on the DC correction.

6. The method of claim 1, wherein providing the DC correction to the signal path comprises summing a DC offset correction voltage with signal on the signal path.

* * * * *